(12) United States Patent
Tokunaga (10) Patent No.: US 8,673,661 B2
(45) Date of Patent: Mar. 18, 2014

(54) DISPLAY APPARATUS AND METHOD OF MANUFACTURING THE SAME

(75) Inventor: Kazuhiko Tokunaga, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/403,735

(22) Filed: Feb. 23, 2012

(65) Prior Publication Data

US 2012/0241744 A1    Sep. 27, 2012

(30) Foreign Application Priority Data

Mar. 24, 2011  (JP) ................................. 2011-066747

(51) Int. Cl.
*H01L 21/336* (2006.01)
*H01L 21/84* (2006.01)

(52) U.S. Cl.
USPC ................. 438/23; 438/34; 438/158; 257/59; 257/71; 257/72; 257/E21.414

(58) Field of Classification Search
USPC ..................... 438/23, 158, 34; 257/59, 71, 72, 257/E21.414
See application file for complete search history.

(56) References Cited

U.S. PATENT DOCUMENTS

| | | | | |
|---|---|---|---|---|
| 5,032,531 A | * | 7/1991 | Tsutsui et al. | 438/30 |
| 5,320,973 A | * | 6/1994 | Kobayashi | 438/158 |
| 5,567,633 A | * | 10/1996 | Gosain et al. | 438/158 |
| 5,643,817 A | * | 7/1997 | Kim et al. | 205/124 |
| 5,811,318 A | * | 9/1998 | Kweon | 438/30 |
| 5,821,133 A | * | 10/1998 | Kawai et al. | 438/30 |
| 5,998,230 A | * | 12/1999 | Gee-Sung et al. | 438/30 |
| 6,069,019 A | * | 5/2000 | Ishii et al. | 438/30 |
| 6,653,178 B2 | * | 11/2003 | Tsujimura et al. | 438/158 |
| 6,855,954 B1 | * | 2/2005 | Zhang | 257/59 |
| 7,592,207 B2 | * | 9/2009 | Nakamura et al. | 438/149 |
| 7,608,493 B2 | * | 10/2009 | Heo et al. | 438/155 |
| 8,222,095 B2 | * | 7/2012 | Luo et al. | 438/158 |
| 8,293,595 B2 | * | 10/2012 | Yamazaki et al. | 438/158 |
| 8,309,956 B2 | * | 11/2012 | Arai et al. | 257/43 |
| 8,426,851 B2 | * | 4/2013 | Morosawa et al. | 257/43 |
| 2010/0025675 A1 | * | 2/2010 | Yamazaki et al. | 257/43 |
| 2010/0084650 A1 | * | 4/2010 | Yamazaki et al. | 257/43 |
| 2010/0133525 A1 | * | 6/2010 | Arai et al. | 257/40 |
| 2010/0244020 A1 | * | 9/2010 | Sakata et al. | 257/43 |
| 2010/0244029 A1 | * | 9/2010 | Yamazaki et al. | 257/52 |
| 2010/0264412 A1 | * | 10/2010 | Yamazaki et al. | 257/43 |
| 2011/0095288 A1 | * | 4/2011 | Morosawa et al. | 257/43 |
| 2011/0147740 A1 | * | 6/2011 | Jeong et al. | 257/43 |

(Continued)

FOREIGN PATENT DOCUMENTS

| CN | 102800709 | * 11/2012 | ............ H01L 21/786 |
|---|---|---|---|
| JP | 2008-205469 | 9/2008 | |

*Primary Examiner* — Mary Wilczewski
(74) *Attorney, Agent, or Firm* — Sheridan Ross P.C.

(57) ABSTRACT

A display apparatus including: a plurality of thin film transistors; and an interconnect region, wherein each of the thin film transistors includes a first protective film held in contact with a channel layer and disposed remotely from a gate electrode, a second protective film disposed on the first protective film, and a source and drain electrode assembly including a pair of electrodes held in contact with the channel layer, and the interconnect region includes a first interconnect, a second interconnect disposed in alignment with the first interconnect, and an insulating layer interposed between the first interconnect and the second interconnect and having a stacked structure including a first insulating film joined to the gate insulating film and a second insulating film joined to the second protective film.

3 Claims, 10 Drawing Sheets

(56) References Cited

U.S. PATENT DOCUMENTS

| | | |
|---|---|---|
| 2012/0112182 A1* | 5/2012 | Ishii et al. ................. 257/43 |
| 2012/0218485 A1* | 8/2012 | Chikama et al. ............ 349/39 |
| 2012/0241744 A1* | 9/2012 | Tokunaga ................... 257/59 |
| 2012/0267621 A1* | 10/2012 | Chen et al. ................. 257/43 |
| 2012/0273779 A1* | 11/2012 | Yamazaki et al. .......... 257/43 |
| 2012/0286259 A1* | 11/2012 | Park et al. .................. 257/43 |
| 2012/0313093 A1* | 12/2012 | Kim et al. ................... 257/43 |
| 2013/0023086 A1* | 1/2013 | Chikama et al. ........... 438/104 |
| 2013/0048994 A1* | 2/2013 | Choi et al. .................. 257/59 |

\* cited by examiner

DISPLAY APPARATUS AND METHOD OF MANUFACTURING THE SAME

BACKGROUND

The present disclosure relates to a display apparatus including thin film transistors (TFTs) each having an oxide semiconductor layer as a channel and a method of manufacturing such a display apparatus.

Heretofore, it has been customary for liquid crystal displays (LCDs) to incorporate TFTs having a channel-etched bottom gate structure wherein a channel layer and a source and drain electrode assembly are directly stacked one on the other. One problem with LCDs with such TFTs is that electric capacitances (cross capacitances) between interconnects around the TFTs are large because of requirements for high-definition images to be displayed and increased frame rates.

Many TFTs including an oxide semiconductor as a channel layer have a bottom gate structure wherein the channel area includes a protective film. The channel layer that is mainly formed of an oxide semiconductor is improved to minimize damage due to various plasmas at the time the TFTs are fabricated. For example, according to Japanese Patent Laid-open No. 2008-205469, after a channel layer is formed, the surface of the channel layer is processed by an oxygen plasma and cleaned in a wet environment to increase the electric resistance of the surface of the channel layer. The increased electric resistance is effective to prevent the surface of the channel layer from being damaged and to reduce deteriorations of the characteristics of the channel layer in subsequent fabrication processes.

SUMMARY

However, damage to the surface of the channel layer cannot sufficiently be minimized by the processing using the oxygen plasma and the wet cleaning process. In addition, no solution has been proposed to reduce the cross capacitances between interconnects.

The present technology has been devised in view of the above circumstances, and makes it possible to provide a display apparatus which reduces cross capacitance of an interconnect region while preventing deteriorations of the characteristics of the thin film transistors and a manufacturing method thereof.

According to the present disclosure, there is provided a display apparatus including a plurality of thin film transistors and an interconnect region. Each of the thin film transistors includes a gate electrode, a channel layer mainly made of an oxide semiconductor, a gate insulating film disposed between the gate electrode and the channel layer, a first protective film held in contact with the channel layer and disposed remotely from the gate electrode, a second protective film disposed on the first protective film, and a source and drain electrode assembly including a pair of electrodes held in contact with the channel layer. The interconnect region includes a first interconnect, a second interconnect disposed in alignment with the first interconnect, and an insulating layer interposed between the first interconnect and the second interconnect and having a stacked structure including a first insulating film joined to the gate insulating film and a second insulating film joined to the second protective film.

According to the present disclosure, there is also provided a method of manufacturing a display apparatus, including (A1) forming a gate electrode and a first interconnect layer on a substrate, (B1) forming a gate insulating film and a first insulating film respectively on the gate electrode and the first interconnect layer, and thereafter forming a semiconductor layer mainly made of an oxide semiconductor on the gate insulating film and the first insulating film, (C1) forming a first protective film on the semiconductor layer, thereafter etching the semiconductor layer and the first protective film, forming a channel layer mainly made of an oxide semiconductor on which the first protective film is stacked, in a region aligned with the gate electrode, and removing the semiconductor layer and the first protective film from at least a region aligned with the first interconnect layer, (D1) forming a second protective film and a second insulating film respectively on the first protective film and the first insulating film, and thereafter etching the second protective film, and (E1) forming a pair of electrodes of a source and drain electrode assembly in contact with the channel layer, and forming a second interconnect layer in a position aligned with at least the first interconnect layer.

With the display apparatus and the method of manufacturing the display apparatus according to the present disclosure, the first protective film is formed on the channel layer in each of the thin film transistors to protect the channel layer from being damaged. As the second insulating film is directly stacked on the first insulating film in the interconnect region, a desired film thickness is maintained between the first interconnect layer and the second interconnect layer.

According to the present disclosure, after the semiconductor layer mainly made of an oxide semiconductor is formed on the gate insulating film in each of the thin film transistors and the first insulating film in the interconnect region, the first protective film is formed on the semiconductor layer. Then, the semiconductor layer and the first protective film are simultaneously etched to remove the first protective film from at least a region aligned with the first interconnect layer. Therefore, in each of the thin film transistors, the channel layer is prevented from being damaged by the first protective film on the channel layer, minimizing deteriorations of the characteristics of the thin film transistors. In the interconnect region, the second insulating film is directly stacked on the first insulating film to maintain a desired film thickness between the first interconnect layer and the second interconnect layer, resulting in a reduced cross capacitance.

DETAILED DESCRIPTION OF THE PREFERRED EMBODIMENTS

Display apparatus according to preferred embodiments of the present disclosure will be described in detail below with reference to the drawings. Details of the display apparatus will be described in the following order:
1. Embodiment (Bottom Gate TFTs)
(1) Arrangement of display apparatus
(1-1) TFT
(1-2) Interconnect
(1-3) Overall arrangement of display apparatus
   (2) Method of Manufacturing Display Apparatus
2. Arrangement of module including display apparatus
3. Specific Applications 1 through 5

1. Embodiment (1) Arrangement of Display Apparatus

Figure 1:
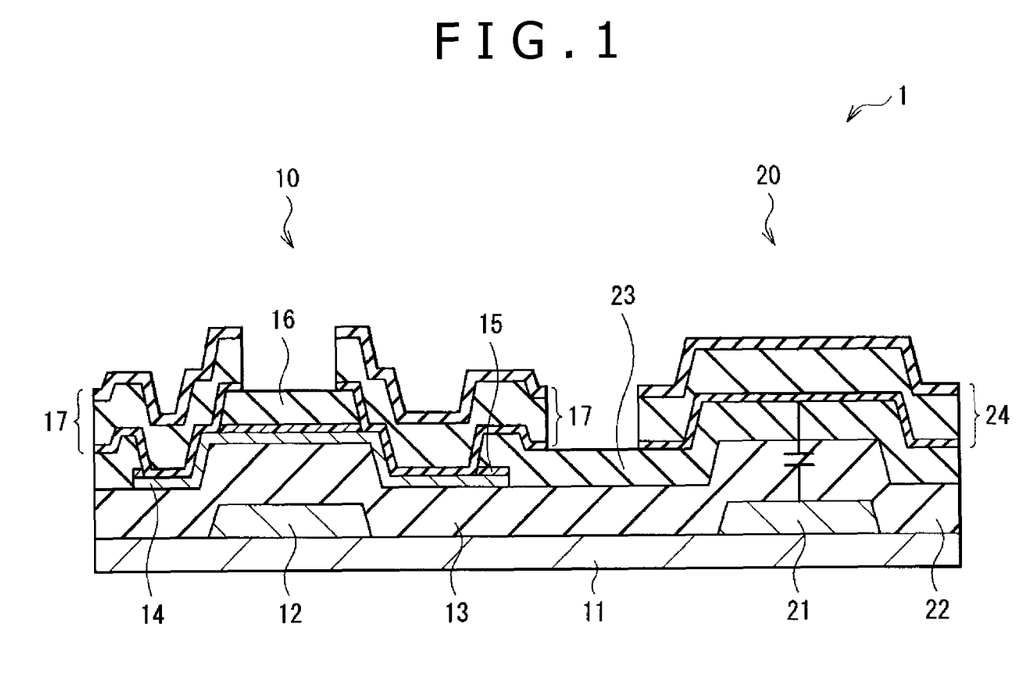
FIG. 1 is a fragmentary cross-sectional view of a display apparatus according to an embodiment of the present disclosure.

FIG. 1 is a fragmentary cross-sectional view of a display apparatus 1 according to an embodiment of the present disclosure. As shown in FIG. 1, a display apparatus 1 includes a TFT 10 and an interconnect region 20 that are disposed on a substrate 11. The TFT 10 includes a gate electrode 12, a gate insulating film 13, a channel layer 14, a first protective film 15, a second protective film 16, and a source and drain electrode assembly 17 which are disposed, in the order named, on the substrate 11. The interconnect region 20 includes a first interconnect layer 21, a first insulating film 22, a second insulating film 23, and a second interconnect layer 24 which are disposed, in the order named, on the substrate 11.

The substrate 11 is made of silicon, for example. However, the substrate 11 may be made of synthetic silica, glass, metal, resin, or resin film.

(1-1) Arrangement of TFT

The gate electrode 12 controls the density of electrons in the channel layer 14 with a gate voltage applied to the TFT 10. For example, the gate electrode 12 is of a two-layer structure including a single layer of molybdenum (Mo) having a thickness of 100 nm or an Mo layer having a thickness of 50 nm and an aluminum (Al) layer or aluminum alloy layer having a thickness of 400 nm. The aluminum alloy layer may be an aluminum-neodymium alloy layer, for example.

The gate insulating film 13 is made of an insulating film including silicon (Si), for example. The gate insulating film 13 covers the gate electrode 12, and is deposited on the entire surface of the substrate 11 and over the gate electrode 12, for example.

The channel layer 14 is an oxide semiconductor layer made mainly of zinc oxide (ZnO), indium tin oxide (ITO), or In—M—Zn—O (M represents at least one of Ga, Al, Fe, and Sn), for example.

The first protective film 15 is mainly made of an insulating film material, e.g., an oxide such as $SiO_2$, for example. However, the first protective film 15 may be mainly made of aluminum oxide ($Al_2O_3$). The first protective film 15 serves to protect the channel layer 14. The first protective film 15 is formed immediately after the channel layer 14 is deposited to protect the surface of the channel layer 14 from damage due to various plasmas that are used when the display apparatus 1 is fabricated. The first protective film 15 has a film thickness which should preferably be in the range from 10 nm to 500 nm. If the film thickness of the first protective film 15 is smaller than 10 nm, then its capability to protect the channel layer 14 is lowered. If the film thickness of the first protective film 15 is greater than 500 nm, then the process time for etching the first protective film 15 is longer than necessary. More preferably, the film thickness of the first protective film 15 should be in the range from 50 nm to 300 nm.

The second protective film 16 is disposed in a region in alignment with the gate electrode 12. The second protective film 16 is mainly made of an insulating film material, e.g., an oxide such as $SiO_2$, for example, as with the first protective film 15. Specifically, the second protective film 16 is of a stacked structure of silicon nitride and silicon oxide (SiN/$SiO_2$) or a stacked structure of aluminum oxide and silicon oxide ($Al_2O_3/SiO_2$). The second protective film 16 has a film thickness which should preferably be in the range from 10 nm to 500 nm, and more preferably be in the range from 50 nm to 300 nm.

The source and drain electrode assembly 17 extends from the surface of the second protective film 16 over the side surfaces of the first protective film 15 onto the surface of the channel layer 14. The source and drain electrode assembly 17 is made of metal such as Mo, Al, titanium (Ti), or the like, or is in the form of a multilayer film of those metals.

A protective film, not shown, which is made of the same material as the first protective film 15 or the second protective film 16, for example, is disposed on the second protective film 16 and the source and drain electrode assembly 17.

(1-2) Interconnect

The first interconnect layer 21 and the second interconnect layer 24, which serve to transmit signals, are in the form of signal lines DTL and scanning lines WSL (see FIG. 2) for controlling the TFT 10, for example. The first interconnect layer 21 is formed of the same material in the same process as the gate electrode 12. The second interconnect layer 24 is formed of the same material in the same process as the source and drain electrode assembly 17.

The first insulating film 22 and the second insulating film 23 serve to prevent short circuits between the first interconnect layer 21 and the second interconnect layer 24. The first insulating film 22 and the second insulating film 23 are formed of the same material in the same process as the gate electrode 13 and the second protective film 16. The second insulating film 23 is directly deposited on the first insulating film 22.

(1-3) Overall Arrangement of Display Apparatus

Figure 2:
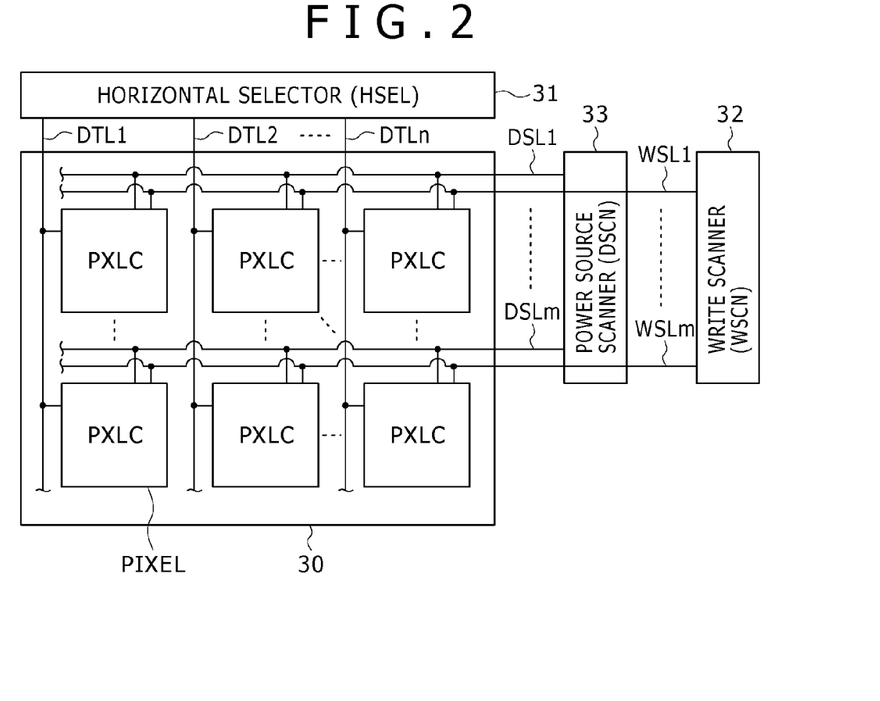
FIG. 2 is a block diagram of the display apparatus shown in FIG. 1.

An overall arrangement of the display apparatus 1 which includes the TFT 10 and the interconnect region 20 will be described below with reference to FIG. 2. FIG. 2 is a block diagram of the display apparatus 1 which is used as an ultra-thin organic light emission color display. As shown in FIG. 2, the display apparatus 1 includes a display region 30 on the substrate 11 with TFTs 10. The display region 30 includes a matrix of organic light-emitting elements PXLC including a plurality of organic light-emitting elements as display elements. Around the display region 30, there are disposed a horizontal selector (HSEL) 31 as a signal section and a write scanner (WSCN) 32 and a power source scanner (DSCN) 33 as a scanner section.

The display region 30 includes an array of signal lines DTL1 through DTLn (collectively indicated as "DTL") extending along columns and an array of scanning lines WSL1 through WSLm (collectively indicated as "WSL") and an array of drive lines DSL1 through DSLm (collectively indicated as "DSL") extending along rows. The signal lines DTL and the scanning lines WSL cross each other at crossings where there are disposed pixel circuits 40 each including an organic light-emitting element PXLC (red, blue, and green pixels (subpixels)). The signal lines DTL are connected to the horizontal selector 31, which supplies video signals to the signal lines DTL. The scanning lines WSL are connected to the write scanner 32. The drive lines DSL are connected to the power source scanner 33.

Figure 3:
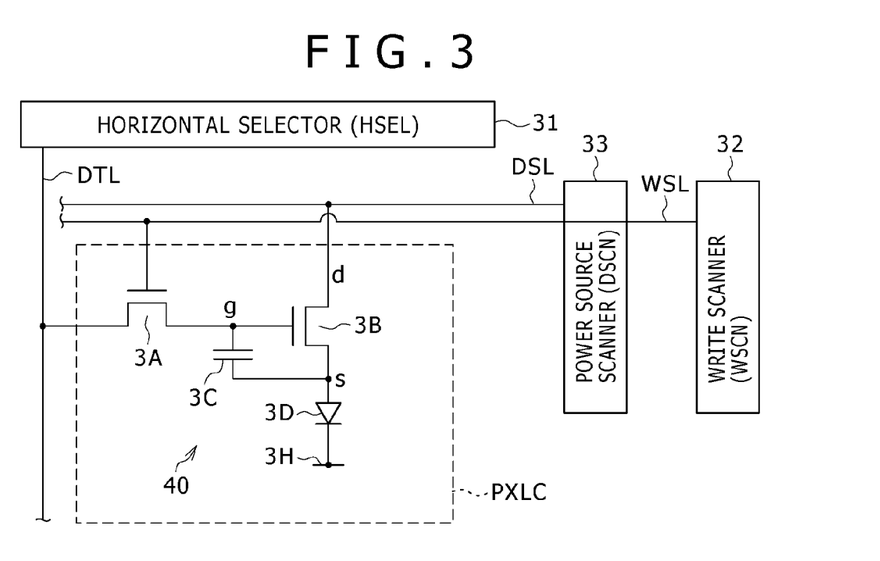
FIG. 3 is a circuit diagram, partly in block form, of a pixel of the display apparatus shown in FIG. 2.

FIG. 3 shows an example of each of the pixel circuits 40. As shown in FIG. 3, each of the pixel circuits 40 is an active drive circuit including a sampling transistor 3A, a drive transistor 3B, a holding capacitor 3C, and a light-emitting element 3D in the form of an organic light-emitting element PXLC. The transistors 3A, 3B include thin film transistors according to an embodiment of the present disclosure.

The sampling transistor 3A has a gate connected to the corresponding scanning line WSL and a source and a drain, one of which is connected to the corresponding signal line DTL and the other co the gate g of the drive transistor 3B. The drive transistor 3B has a drain d connected to the corresponding drive line DSL and a source s connected to the anode of the light-emitting element 3D. The light-emitting element 3D has its cathode connected to ground interconnect 3H. The ground interconnect 3H is connected in common to all the organic light-emitting elements PXLC. The holding capacitor 3C is connected between the source s and the gate g of the drive transistor 3B.

The sampling transistor 3A is rendered conductive by a control signal supplied from the scanning line WSL to sample the signal potential of a video signal supplied from the signal line DTL and hold the sampled signal potential in the holding capacitor 3C. In response to a current supplied from the power line DSL that is held at a first potential, the drive transistor 3B supplies a drive current to the light-emitting element 3D depending on the signal potential held in the holding capacitor 3C. The light-emitting element 3D is energized by the supplied drive current to emit light at a luminance level depending on the signal potential of the video signal.

The display apparatus 1 operates as follows: Depending on the control signal supplied from the scanning line WSL, the sampling transistor 3A is rendered conductive to sample the signal potential of the video signal supplied from the signal line DTL and hold the sampled signal potential in the holding capacitor 3C. The drive line DSL at the first potential supplies a current to the drive transistor 3B, which supplies a drive current to the light-emitting element 3D (red, blue, and green organic light-emitting elements) depending on the signal potential held in the holding capacitor 3C. In response to the supplied drive current, the light-emitting element 3D emits light at a luminance level depending on the signal potential of the video signal.

The display apparatus 1 can be manufactured according to a manufacturing method shown in FIGS. 4A through 4D, as described below.

(2) Method of Manufacturing Display Apparatus

Figure 4A:
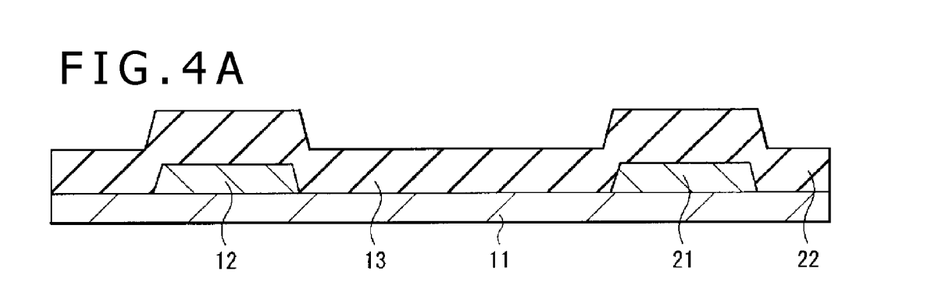
FIGS. 4A through 4D are cross-sectional views showing a sequence of steps of a method of manufacturing the display apparatus shown in FIG. 1.

As shown in FIG. 4A, a molybdenum (Mo) layer is deposited on the substrate 11 of glass by sputtering, after which the gate electrode 12 and the first interconnect layer 21 are formed thereon by photolithography and dry etching. Then, a film of $SiO_x$ is deposited to a thickness of 200 nm on the entire surface of the substrate 11 by plasma CVD (Chemical Vapor Deposition), forming the gate insulating film 13 and the first insulating layer 22.

Figure 4B:
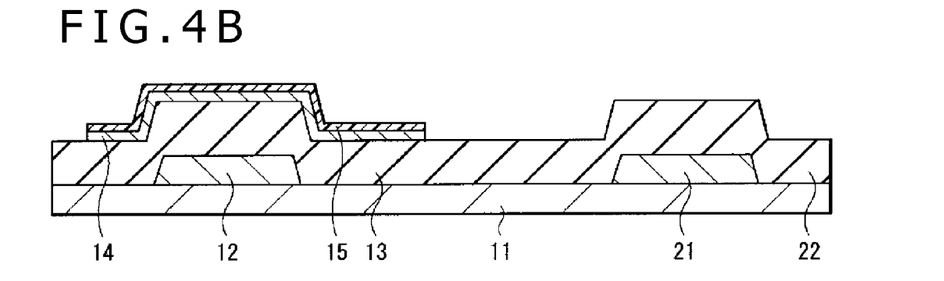

Then, as shown in FIG. 4B, the semiconductor layer 14A (not shown) is deposited on the gate insulating film 13 by sputtering, using an oxide target of In—Ga—Zn, for example, in a vacuum. A film of $SiO_x$ is then deposited to a thickness of 20 nm as the first protective film 15 by CVD, after which the first protective film 15 and the semiconductor layer 14A are processed by photolithography and etching with a solution of diluted hydrofluoric acid, for example, forming the channel layer 14 in the region aligned with the gate electrode 13.

Figure 4C:
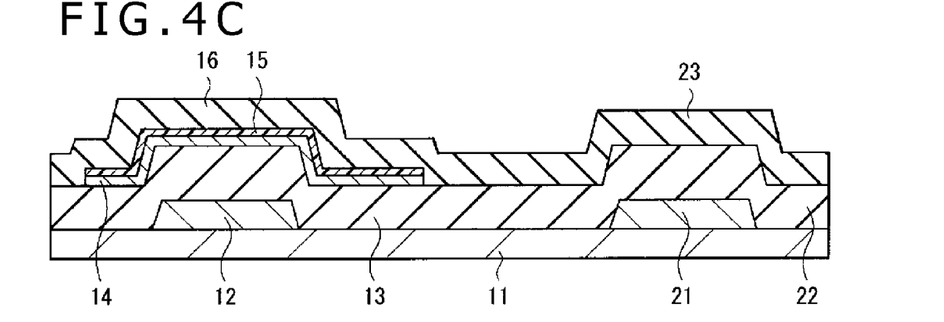

Then, as shown in FIG. 4C, a film of $SiO_x$ is deposited to a thickness of 200 nm on the entire surfaces of the first insulating film 15, the gate insulating film 13 and the first insulating film 22 by plasma CVD, forming the second protective film 16 and the second insulating film 23.

Figure 4D:
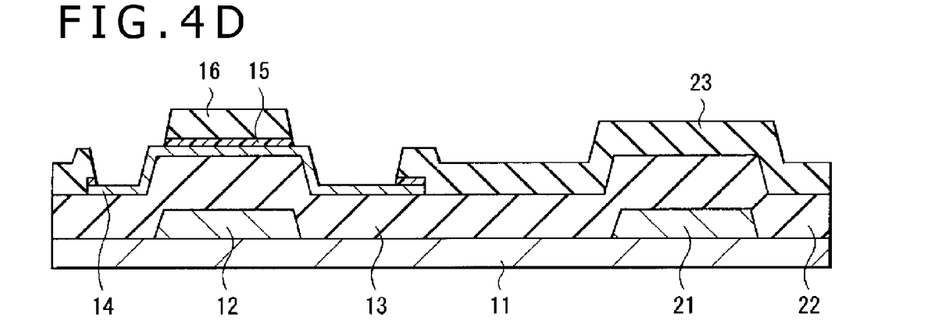

Then, as shown in FIG. 4D, a contact region for contact with the channel layer 14 and the source and drain electrode assembly 17 to be formed in a next step is formed by resist patterning by utilizing photolithography and dry etching, for example. Specifically, the first insulating film 15 and the second protective film 16 are simultaneously processed into a given shape using a $CF_4$ gas.

Then, films of Ti, Al, Mo are deposited to respective thicknesses of 50 nm, 900 nm, 50 nm by sputtering, and processed into the source and drain electrode assembly 17 and the second interconnect layer 24 by dry etching, using an oxygen-added $Cl_2CF_4$ gas. In this manner, the interconnect region 20 is formed. Finally, the entire assembly is heated to remove oxygen defects from the channel layer 14. Specifically, the entire assembly is heated at an oxygen concentration of about 40% and a temperature of 300 degrees for two hours in the atmosphere of nitrogen and oxygen, thereby forming the TFTs 10. The display apparatus 1 according to the present embodiment is now completed.

Figure 5:
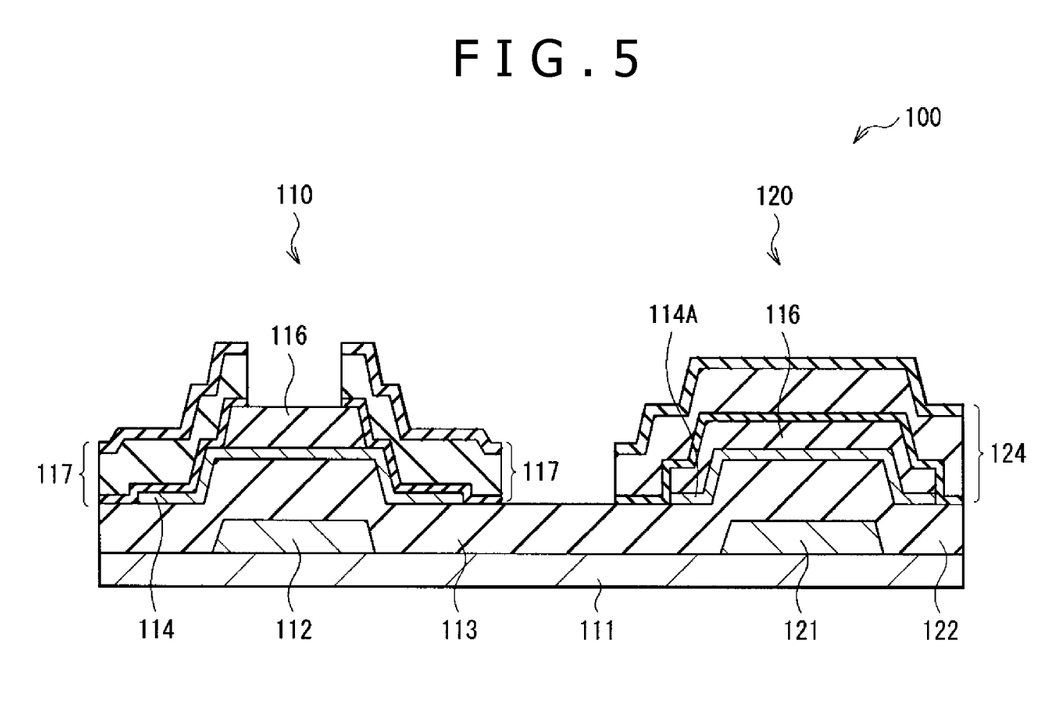
FIG. 5 is a fragmentary cross-sectional view of a display apparatus according to a comparative example.

FIG. 5 shows in fragmentary cross section a display apparatus 100 according to a comparative example. As shown in FIG. 5, the display apparatus 100 includes a TFT 110 having a single protective film 116 on a channel layer 114 and an interconnect region 120 having a semiconductor layer 114A sandwiched between a first insulating film 122 and the protective film 116.

FIGS. 6A through 6D are cross-sectional views showing a sequence of steps of a method of manufacturing the display apparatus 100 shown in FIG. 5. The steps of the method of manufacturing the display apparatus 100 shown in FIG. 5 will briefly be described below.

Figure 6A:
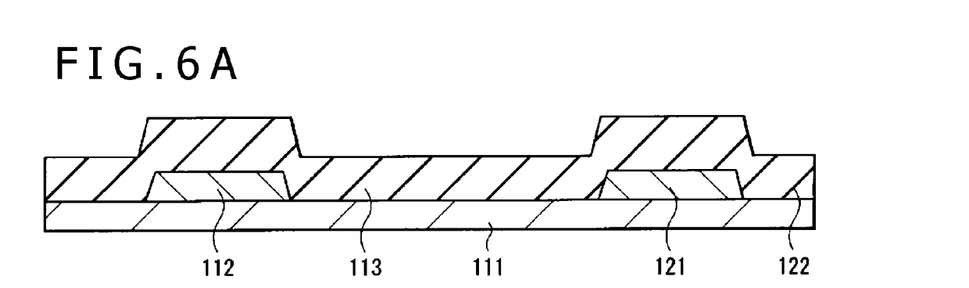
FIGS. 6A through 6D are cross-sectional views showing a sequence of steps of a method of manufacturing the display apparatus shown in FIG. 5.
Figure 6B:
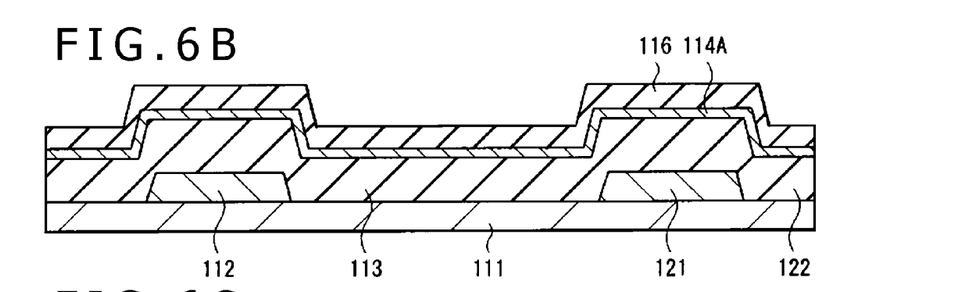
Figure 6C:
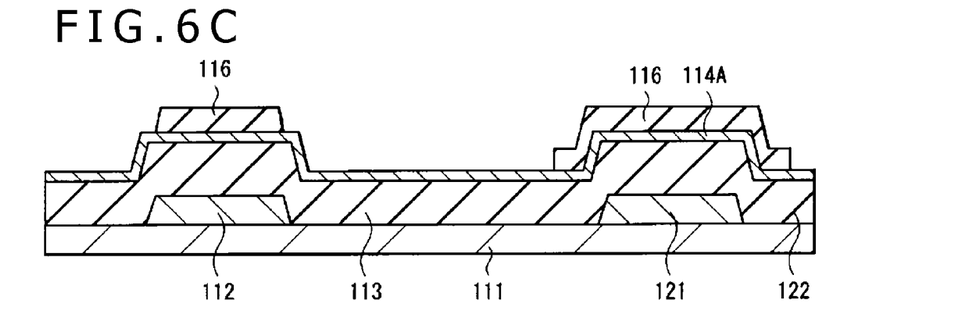
Figure 6D:
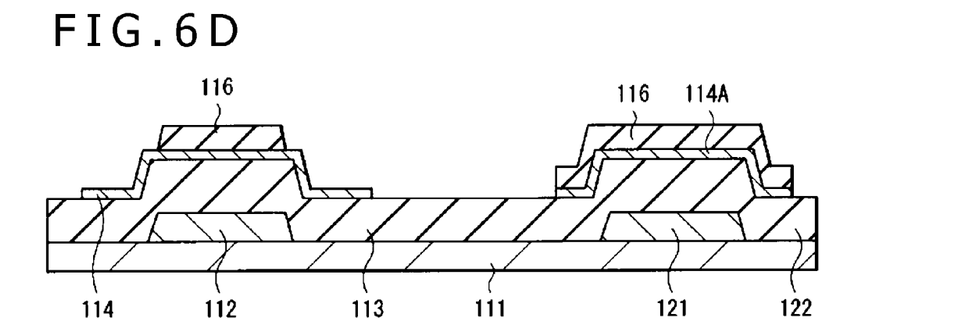

As shown in FIG. 6A, a gate electrode 112 and a first interconnect layer 121 are deposited on a substrate 111, and thereafter a gate insulating film 113 and a first insulating film 122 are formed on the entire surface of the substrate 111, the gate electrode 112, and the first interconnect layer 121. Then, as shown in FIG. 6B, a semiconductor layer 114A and a protective film 116, which correspond to the second protective film 16 and the second insulating film 23, are formed on the gate insulating film 113. Then, as shown in FIG. 6C, the protective film 116 is processed by photolithography and etching, and, as shown in FIG. 6D, the semiconductor layer 114A is processed by photolithography and etching, forming a channel layer 114. Finally, metal layers corresponding to a source and drain electrode assembly 117 and a second interconnect layer 124 are deposited on the entire surface of the protective film 116, the channel layer 114, and the substrate 111, and then processed, completing the display apparatus 100.

In the display apparatus 100 thus fabricated, the TFT 110 and the interconnect region 120 suffer the following problems: In the TFT 110, the protective film 116 deposited on the entire surface is processed into a desired shape by etching. At this time, the channel layer 114 below the protective layer 116 is exposed to various plasmas and an etching solution when the protective film 116 is etched. Therefore, the surface of the channel layer 114 is damaged, deteriorating the characteristics of the TFT 110. In the interconnect region 120, as the semiconductor layer 114A remains between the first insulating film 122 and the protective film 116, a short circuit develops between the semiconductor layer 114A and the second interconnect layer 124 which extends from the surface of the protective film 116 to the substrate 111. The cross capacitance between the first interconnect layer 121 and the second interconnect layer 124 is thus substantially equal to a capacitance provided by the film thickness of the first insulating film 122. In other words, the cross capacitance increases to reduce the reliability of the display apparatus, e.g., to cause signal transmission failures.

According to the present embodiment, the first protective film 15 is formed on the channel layer 14 (semiconductor layer 14A). Therefore, the channel layer 14 is prevented from being damaged by various plasmas in the TFT 10. Further according to the present embodiment, the semiconductor layer 14A, other than the region thereof aligned with the gate electrode 12, and the first protective film 15 are removed, i.e., the channel layer 14 in the region above the first interconnect layer 21 is removed. Thus, the first insulating film 22 and the second insulating film 23 are directly stacked in the interconnect region 20, providing a sufficient film thickness between the first interconnect layer 21 and the second interconnect layer 24.

Figure 7A:
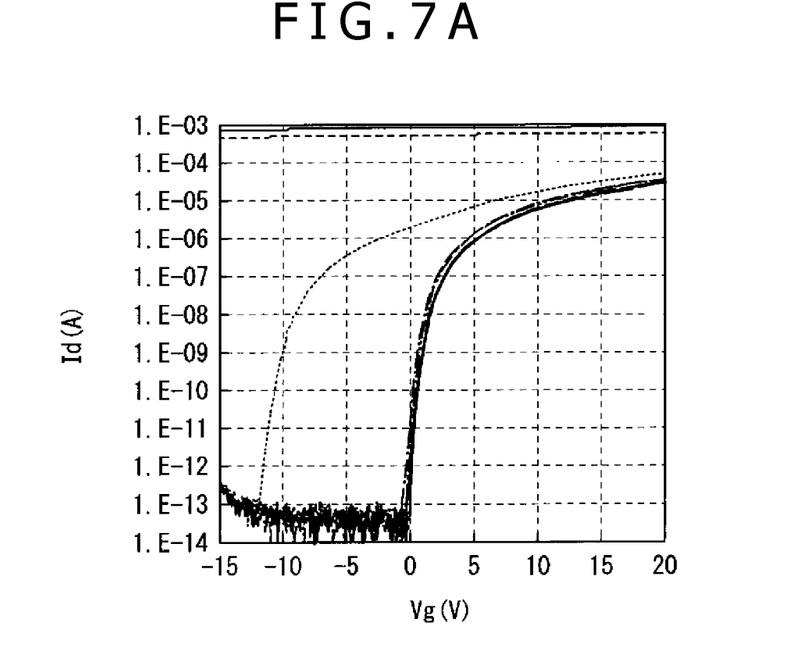
FIGS. 7A and 7B are graphs showing current vs. voltage characteristics of thin film transistors of the display apparatus according to the embodiment and the comparative example.
Figure 7B:
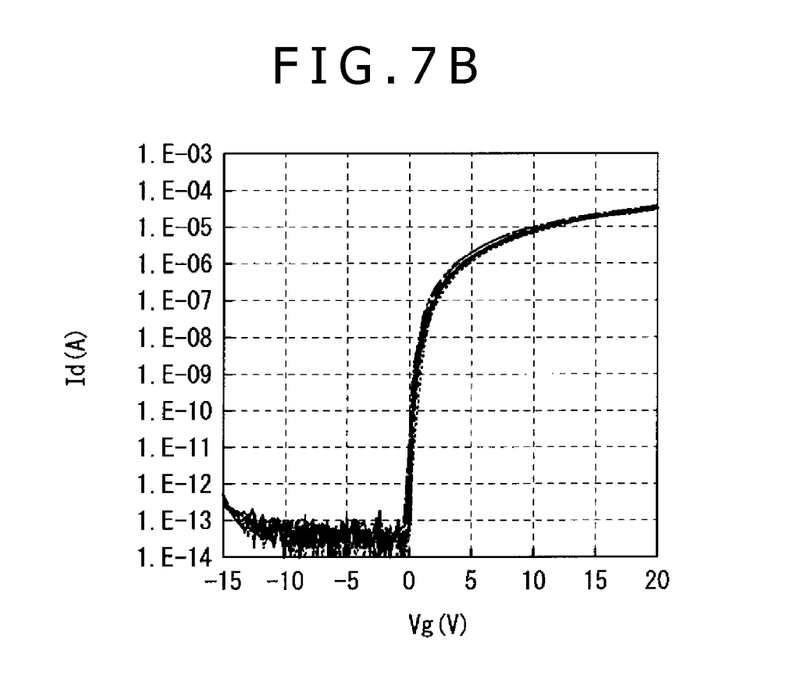

FIGS. 7A and 7B show in-plane current vs. voltage characteristics of the display apparatus according to the present embodiment (FIG. 7B) and the display apparatus according to the comparative example (FIG. 7A). The current vs. voltage characteristics shown in FIG. 7A exhibit variations, whereas current vs. voltage characteristics shown in FIG. 7B exhibit no variations. It can therefore be seen that TFT characteristic variations are reduced when the TFT is fabricated by the manufacturing method according to the present embodiment.

With the display apparatus and the method of manufacturing the same according to the present embodiment, since the first protective film 15 is deposited on the channel layer 14, the surface of the channel layer 14 is prevented from being damaged when the second protective film 16 is processed, thereby minimizing characteristic deteriorations of the TFT 10. Furthermore, since the semiconductor layer 14A on the first interconnect layer 21 is removed, a desired film thickness is maintained between the first interconnect layer 21 and the second interconnect layer 24. In other words, the cross capacitance between the first interconnect layer 21 and the second interconnect layer 24 is reduced to make the display apparatus 1 more reliable.

2. Modules and Applications

Applications of the display apparatus 1 will be described below. The display apparatus 1 can be used as a display apparatus for use on electronic apparatus in all fields for displaying images based on video signals supplied from an external circuit or generated therein, such as television apparatus, digital cameras, laptop personal computers, portable terminal devices such as mobile phones, or video cameras.

(Modules)

Figure 8:
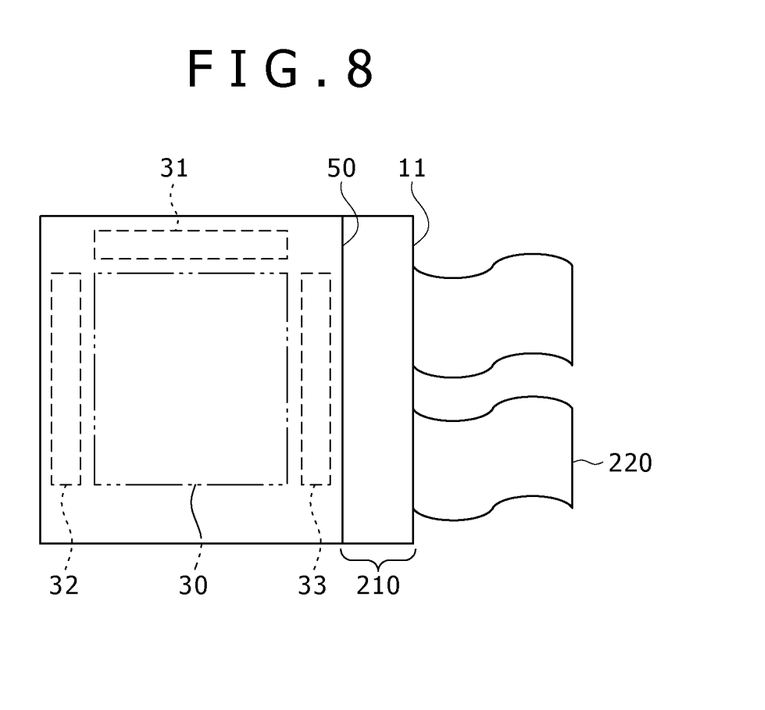
FIG. 8 is a plan view of a module including the display apparatus according to the embodiment.

A module shown in FIG. 8, for example, can be incorporates in various electronic devices including Applications 1 through 5 to be described later. As shown in FIG. 8, the module includes a region 210 on one side of the substrate 11, exposed from a sealing substrate 50 and an adhesive layer, not shown. Interconnects of the horizontal selector 31, the write scanner 32, and the power source scanner 33 extend into the exposed region 210 wherein the interconnects are connected to external connection terminals, not shown. The external connection terminals may be connected to flexible printed circuits (FPCs) 220 for inputting and outputting signals.

3. Applications 1 through 5

(Application 1)

Figure 9:
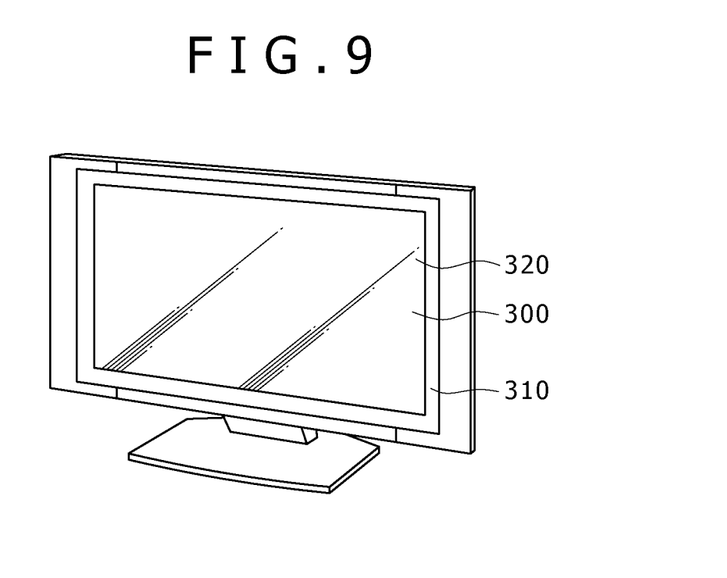
FIG. 9 is a perspective view showing an appearance of the display apparatus according to the embodiment in Application 1.

FIG. 9 shows an appearance of a television apparatus incorporating the display apparatus according to the embodiment. As shown in FIG. 9, the television apparatus has a video display screen unit 300 including a front panel 310 and a filter glass panel 320, for example. The video display screen unit 300 includes the display apparatus according to the embodiment.

(Application 2)

Figure 10A:
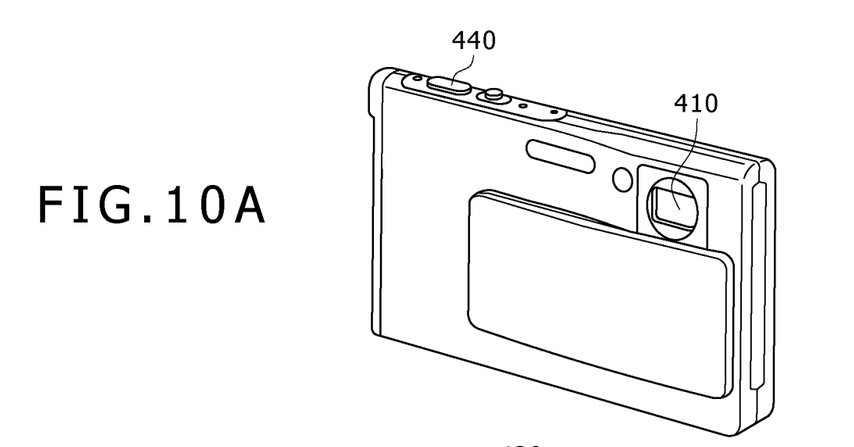
FIG. 10A is a perspective view showing an appearance of the face side of the display apparatus according to the embodiment in Application 2.
Figure 10B:
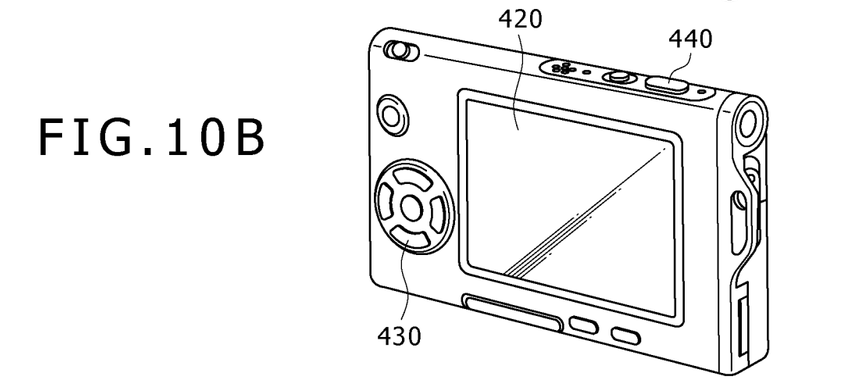
FIG. 10B is a perspective view showing an appearance of the reverse side of the display apparatus according to the embodiment in Application 2.

FIGS. 10A and 10B show an appearance of a digital camera incorporating the display apparatus according to the embodiment. As shown in FIGS. 10A and 10B, the digital camera includes a flash light emitter 410, a display unit 420, a menu switch 430, and a shutter button 440. The display unit 420 includes the display apparatus according to the embodiment.

(Application 3)

Figure 11:
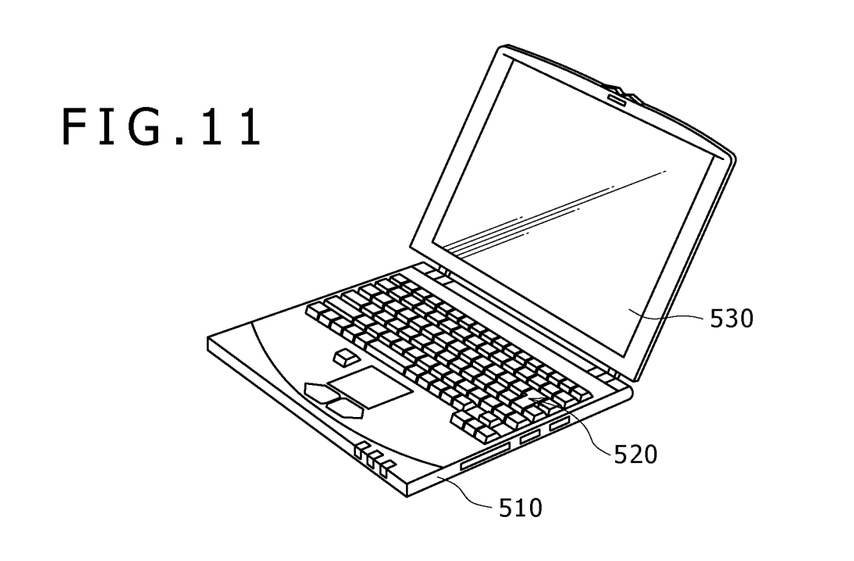
FIG. 11 is a perspective view showing an appearance of the display apparatus according to the embodiment in Application 3.

FIG. 11 shows an appearance of a laptop personal computer incorporating the display apparatus according to the embodiment. As shown in FIG. 11, the laptop personal computer includes a main body 510, a keyboard 520 for entering characters, etc., and a display unit 530 for display images. The display unit 530 includes the display apparatus according to the embodiment.

(Application 4)

Figure 12:
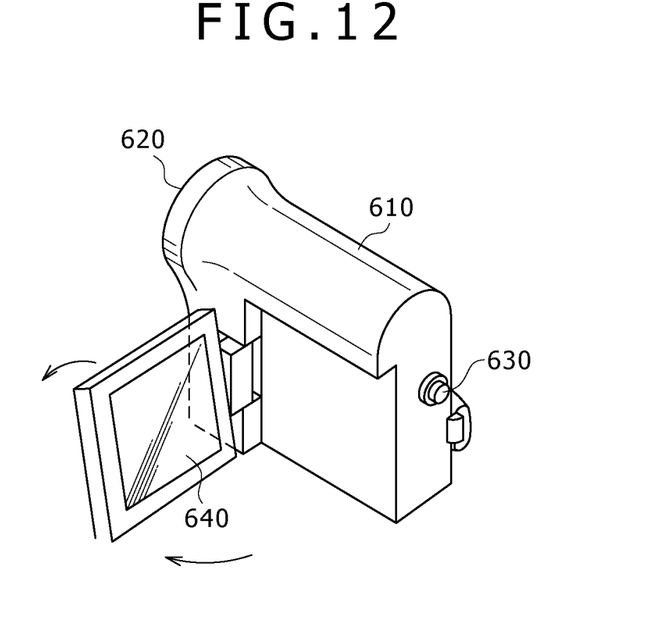
FIG. 12 is a perspective view showing an appearance of the display apparatus according to the embodiment in Application 4.
Figure 13A:
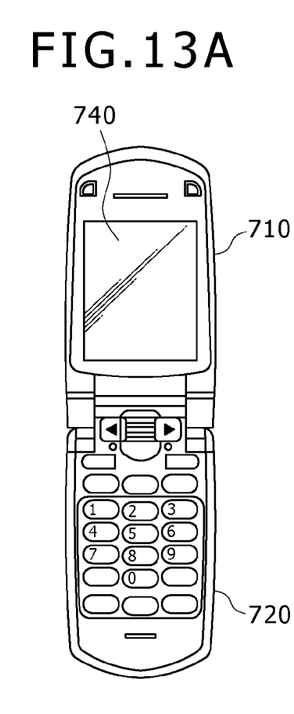
FIG. 13A is a front elevational view showing an appearance of the display apparatus according to the embodiment in Application 5, the display apparatus being shown as being open.
Figure 13B:
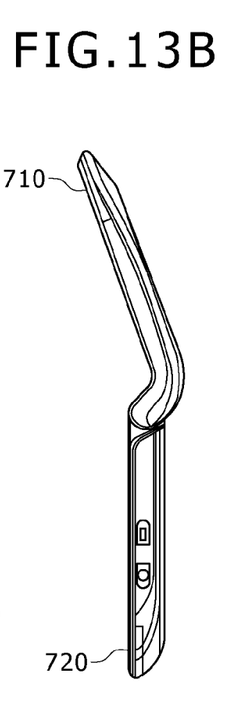
FIG. 13B is a side elevational view showing an appearance of the display apparatus according to the embodiment in Application 5, the display apparatus being shown as being open.
Figure 13C:
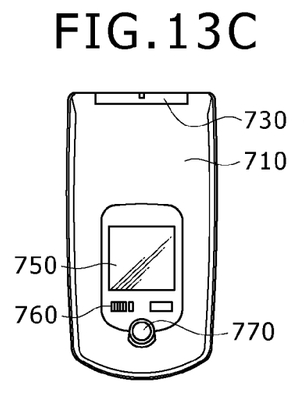
FIG. 13C is a front elevational view showing an appearance of the display apparatus according to the embodiment in Application 5, the display apparatus being shown as being closed.
Figure 13D:
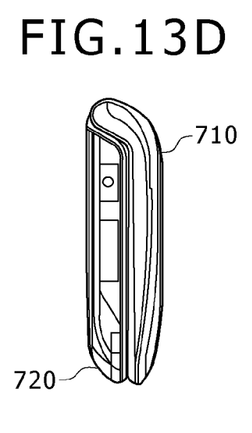
FIG. 13D is a left-hand side elevational view showing an appearance of the display apparatus according to the embodiment in Application 5, the display apparatus being shown as being closed.
Figure 13E:
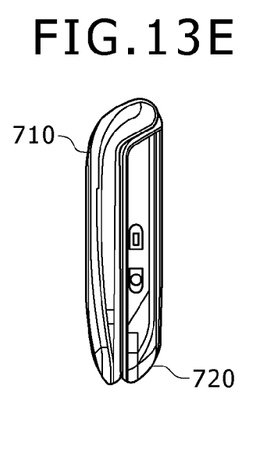
FIG. 13E is a right-hand side elevational view showing an appearance of the display apparatus according to the embodiment in Application 5, the display apparatus being shown as being closed.
Figure 13F:
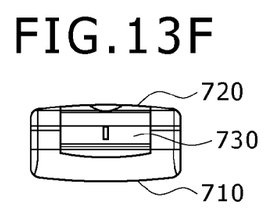
FIG. 13F is a plan view showing an appearance of the display apparatus according to the embodiment in Application 5, the display apparatus being shown as being closed.
Figure 13G:
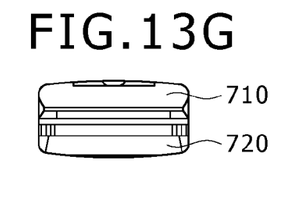
FIG. 13G is a bottom view showing an appearance of the display apparatus according to the embodiment in Application 5, the display apparatus being shown as being closed.

FIG. 12 shows an appearance of a video camera incorporating the display apparatus according to the embodiment. As shown in FIG. 12, the video camera includes a main body 610, a lens 620 for capturing images of subjects provided on a front end of the main body 610, a start/stop switch 630 for starting and stopping an image capturing process, and a display unit 640. The display unit 640 includes the display apparatus according to the embodiment.

(Application 5)

FIGS. 13A through 13G show an appearance of a mobile phone incorporating the display apparatus according to the embodiment. As shown in FIGS. 13A through 13G, the mobile phone includes an upper casing 710 and a lower casing 720 which are coupled to each other by a hinge joint 730. The mobile phone also includes a display 740, a subdisplay 750, a picture light 760, and a camera 770. Each of the display 740 and the subdisplay 750 includes the display apparatus according to the embodiment.

The display apparatus 1 according to the embodiment of the present disclosure has been described above. However, the present disclosure is not limited to the above embodiment, but the arrangement of the display apparatus 1 and the method of manufacturing the same can be modified insofar as their modifications have the same advantages as those of the above embodiment.

For example, in the above embodiment, the channel layer 14 is made of In—Ga—Zn. However, the channel layer 14 may be made of Al or Fe rather than Ga. In the above embodiment, the source and drain electrode assembly 17 is of a three-layer structure made of Ti, Al, and Mo. However, the source and drain electrode assembly 17 may be of a three-layer structure made of Mo, Al, and Mo or Ti, Al, and Ti. In the above embodiment, after the channel layer 14 is deposited by sputtering in a vacuum, the assembly is placed in the atmosphere, and then the first protective film 15 and the second protective film 16 are deposited in the order named by CVD. However, the channel layer 14, the first protective film 15, and the second protective film 16 may successively be deposited in a vacuum by a cluster of sputtering and CVD apparatus.

The present disclosure contains subject matter related to that disclosed in Japanese Priority Patent Application JP 2011-066747 filed in the Japan Patent Office on Mar. 24, 2011, the entire content of which is hereby incorporated by reference.

What is claimed is:

1. A method of manufacturing a display apparatus, comprising:

forming a gate electrode and a first interconnect layer on a substrate;

forming a gate insulating film and a first insulating film respectively on said gate electrode and said first interconnect layer, and thereafter forming a semiconductor layer mainly made of an oxide semiconductor on said gate insulating film and said first insulating film;

forming a first protective film on said semiconductor layer, thereafter etching said semiconductor layer and said first protective film, forming a channel layer mainly made of an oxide semiconductor on which said first protective film is stacked, in a region aligned with said gate electrode, and removing said semiconductor layer and said first protective film from at least a region aligned with said first interconnect layer;

forming a second protective film and a second insulating film respectively on said first protective film and said first insulating film, and thereafter etching said second protective film; and forming a pair of electrodes of a source and drain electrode assembly in contact with said channel layer, and forming a second interconnect layer in a position aligned with at least said first interconnect layer, wherein a portion of said first insulating film and a portion of said second insulating film are between at least a portion of said first interconnect layer and at least a portion of said second interconnect layer, and wherein said at least a portion of said first interconnect layer, said portion of said first insulating film, said portion of said second insulating film, and said at least a portion of said second interconnect layer are directly stacked in an interconnect region.

2. The method of manufacturing a display apparatus according to claim 1, wherein said gate insulating film and said first insulating film are formed in one step.

3. The method of manufacturing a display apparatus according to claim 1, wherein said pair of electrodes and said second interconnect layer are formed in one step.

* * * * *